(12) United States Patent
Hoefer et al.

(10) Patent No.: US 8,671,752 B2
(45) Date of Patent: Mar. 18, 2014

(54) SENSOR SYSTEM

(75) Inventors: Holger Hoefer, Sonnenbuehl (DE); Uwe Hansen, Tübingen (DE); Michael Knauss, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 349 days.

(21) Appl. No.: 12/931,011

(22) Filed: Jan. 21, 2011

(65) Prior Publication Data

US 2011/0203369 A1 Aug. 25, 2011

(30) Foreign Application Priority Data

Jan. 27, 2010 (DE) .......................... 10 2010 001 251
Oct. 14, 2010 (DE) .......................... 10 2010 042 438

(51) Int. Cl.
*G01D 11/10* (2006.01)
*G01D 11/24* (2006.01)
*H01L 29/84* (2006.01)
*G01P 15/08* (2006.01)

(52) U.S. Cl.
USPC ................ 73/430; 257/415; 257/417; 73/431

(58) Field of Classification Search
USPC ........................................................... 73/488
See application file for complete search history.

(56) References Cited

U.S. PATENT DOCUMENTS

| 6,222,123 | B1 | 4/2001 | Schwarz | |
|---|---|---|---|---|
| 6,316,840 | B1 | 11/2001 | Otani | |
| 6,983,537 | B2 * | 1/2006 | Park | 29/840 |
| 7,323,766 | B2 * | 1/2008 | Weiblen et al. | 257/666 |
| 7,493,819 | B2 | 2/2009 | Benzel et al. | |
| 2001/0055836 | A1 | 12/2001 | Kunda | |
| 2008/0149730 | A1 * | 6/2008 | Hubmer et al. | 235/492 |
| 2009/0278217 | A1 | 11/2009 | Laming et al. | |
| 2009/0315127 | A1 | 12/2009 | Kulach et al. | |

FOREIGN PATENT DOCUMENTS

DE 197 21 281 12/1998
DE 10 2005 053 861 5/2007

* cited by examiner

*Primary Examiner* — Daniel S Larkin
*Assistant Examiner* — Irving A Campbell
(74) *Attorney, Agent, or Firm* — Kenyon & Kenyon LLP

(57) ABSTRACT

A sensor system includes a supporting element and a sensor element attached to the supporting element and having a main plane of extension. The supporting element has (i) at least one contact element for electrical contacting of the sensor system and (ii) at least one relief structure for stress decoupling, the at least one relief structure being situated in a plane parallel to the main plane of extension essentially between the at least one contact element and the sensor element.

8 Claims, 6 Drawing Sheets

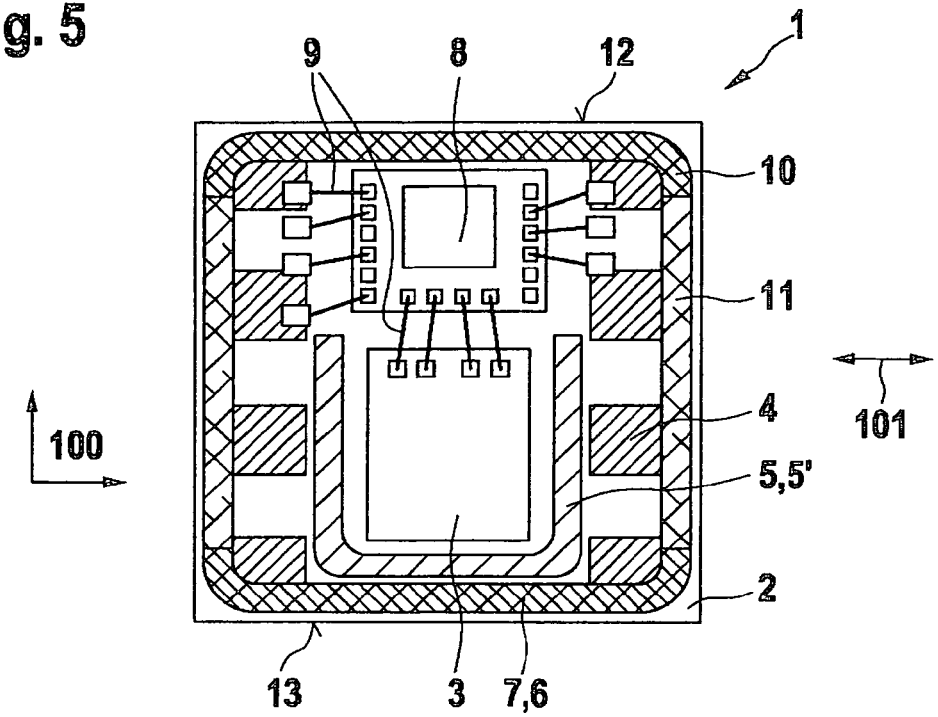
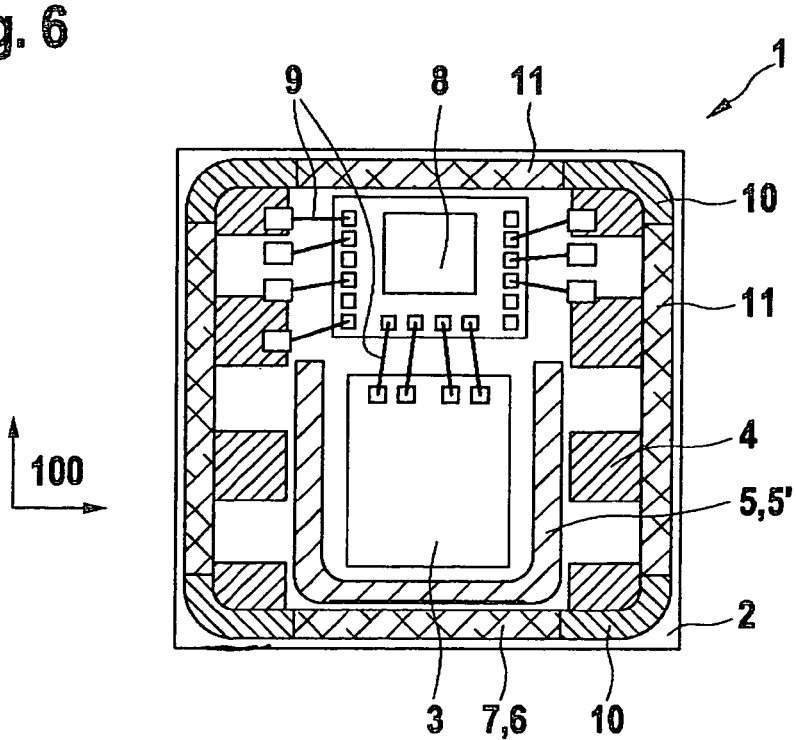

SENSOR SYSTEM

BACKGROUND OF THE INVENTION

1. Field of the Invention

The present invention relates to a sensor system having sensor and a supporting element with at least one contact element for electrical contacting.

2. Description of the Related Art

Such sensor systems are generally known. For example, a chip module for a smart card is known from published German patent application document DE 197 21 281 A1, wherein the chip module is made up essentially of a supporting film, an integrated circuit situated on the top of the supporting film, and a cover surrounding the integrated circuit. In addition, contact points are placed on the underside of the supporting film. Passage openings extend through the supporting film, through which the bond wires that contact the integrated circuit are passed and connected to the contact points. Outside the cover there are also relief slits, which are arranged concentrically and are intended to keep bending stresses away from the cover. A disadvantage of this system is that the relief slits are situated outside the cover, so that mechanical stress which arises in the area of the contact points, for example during soldering of the contact points onto a circuit board, results in bending of the supporting film in the area of the integrated circuit. Furthermore, mechanical stresses which arise at the interface between the cover and the supporting film, for example due to differing coefficients of thermal expansion of the cover and the supporting film, are not absorbed by the relief slits, but instead also result directly in bending of the supporting film in the area of the integrated circuit. Such a system is consequently not usable for an application involving sensor elements, since the bending of the supporting film in the area of the integrated circuit results in drifting of sensor parameters and offsets in sensor signals.

BRIEF SUMMARY OF THE INVENTION

The sensor system according to the present invention has the advantage over the related art that the at least one relief structure is formed essentially between the at least one contact element and the sensor element, so that mechanical stresses which arise between the contact element and the supporting element do not result in bending of the supporting element in the area of the sensor element, but rather are absorbed by the relief structure. In an advantageous manner it is thus possible, in a comparatively simple and inexpensive way, to clearly reduce or prevent drifting of sensor parameters and offsets in corresponding sensor signals compared to the related art, so that a comparatively high measuring precision of the sensor element is achievable. In particular, after the sensor system has been soldered onto another supporting element, for example a circuit board, or after some other further modification of the sensor element which induces stress, no further adjustment of the sensor system is necessary to compensate for an offset shift due to bending of the supporting element. The manufacturing and assembly costs of the sensor system are thus significantly reduced. Furthermore, in this way, in contrast to the related art, mechanical stresses which are based on differing thermal coefficients of expansion of the supporting element and the contact element are also compensated for. The wording "along a plane parallel to the main plane of extension" as used in the present invention means in particular a projection to the plane parallel to the main plane of extension. In other words: The feature according to which the at least one relief slit is situated along a plane parallel to the main plane of extension essentially between the at least one contact element and the sensor element means in particular that the projection of the at least one relief structure onto the plane parallel to the main plane of extension is situated between the projection of the contact element on the one hand and the projection of the sensor element on the other hand, in each case onto the plane parallel to the main plane of extension. In the meaning of the present invention, the contact element for electrical contacting includes in particular a contacting element via which the sensor element is electrically contacted directly or indirectly from outside the sensor system, i.e., preferably through the supporting element and/or the cover. Such contact elements include in particular connecting pins (connecting legs), bonding surfaces, and/or SMD contact surfaces.

According to one preferred specific embodiment of the present invention, it is provided that the sensor system has a cover which is joined in a connecting area to the supporting element, the at least one relief structure being situated along a plane parallel to the main plane of extension essentially between the at least one connecting area and the sensor element. In an advantageous manner, mechanical stress which develops between the cover and the supporting element is thus absorbed by the at least one relief structure between the connecting area and the sensor element, so that bending of the supporting element in the area of the sensor element is reduced or prevented. In particular when using materials having differing thermal expansion coefficients for the supporting element and the cover, under external temperature fluctuations mechanical stresses develop in the connecting area, which in the case of the sensor system according to the present invention are absorbed by the relief structure, and thus do not have a detrimental effect on the sensor parameters of the sensor element. The feature according to which the at least one relief slit is situated along a plane parallel to the main plane of extension essentially between the at least one connecting area and the sensor element signifies in the meaning of the present invention in particular that the projection of the at least one relief structure onto the plane parallel to the main plane of extension is situated between the projection of the connecting area on the one hand and the projection of the sensor element on the other hand, in each case onto the plane parallel to the main plane of extension.

According to one preferred specific embodiment of the present invention, it is provided that the sensor system has at least one damping element, which is attached to the supporting element in such a way that the at least one relief structure is bridged over by the damping element. Due to the relief structure, a sub-area of the supporting element, which is populated by the sensor element, is at least partially decoupled mechanically from the rest of the supporting element by the relief structure. This makes possible in particular a relative movement between the sub-area and the rest of the supporting element. The sub-area thus represents an oscillator, whose oscillation or frequency behavior is determined in an advantageous manner by the damping element. Through appropriate selection of the material of the damping element, as well as of the geometry and dimensioning of the damping element, a desired oscillation or frequency behavior is thus flexibly and inexpensively adjustable. Advantageously, the area required for the sensor system does not increase, or increases only insignificantly, through implementation of the damping element. The damping element is preferably connected indirectly or directly to the supporting element on both sides of the relief structure by direct material engagement, and in particular via an adhesive bond. The damping element preferably includes a (viscous) elastic material, such as silicone or rubber.

According to one preferred specific embodiment, it is provided that the relief structure includes a cut-out in the supporting element, and in particular a relief slit in the supporting element. In an advantageous manner, mechanical stress in the supporting element is thus compensated for or reduced by adjusting the slit width of the relief slit appropriately.

According to one preferred specific embodiment, it is provided that the connecting area includes a first adhesion area and a second adhesion area, the cover being rigidly connected to the supporting element in the first adhesion area and the cover being less rigidly connected to the supporting element in the second adhesion area than in the first adhesion area and in particular in an elastically deformable manner. To stiffen the sensor system, it is advantageous if the cover and the supporting element are joined together rigidly at least in the first adhesion area, while in the second adhesion area, for example, the aim is only to achieve a seal between cover and supporting element to protect the sensor element, for example from sawing water. Preferably, the sensor system includes two first adhesion areas situated opposite the sensor element, so that a particularly stable sensor system is achieved, and at the same time mechanical stresses which are based on differing thermal expansion coefficients between the supporting element and the cover occur only in the supporting element along the connecting line of the two opposing first adhesion areas. These mechanical stresses are absorbed by the relief structures, which are formed in particular only along the connecting line between the first adhesion areas and the sensor element. Due to the elasticity of the second adhesion areas, advantageously no appreciable mechanical stresses pass from the second adhesion areas to the supporting element.

According to one preferred specific embodiment, it is provided that at least one contact element is situated in a plane parallel to the main plane of extension between the at least one relief structure and the connecting area, in particular the second adhesion area. In an advantageous manner, both mechanical stresses coming from the cover and mechanical stresses coming from the contact element are thus absorbed by the at least one relief structure, in such a way that no bending or only slight bending of the supporting element develops in the area of the sensor element.

According to one preferred specific embodiment, it is provided that the relief slit in a plane parallel to the main plane of extension is essentially U-shaped, the relief slit preferably extending at least partially around the sensor element in the plane parallel to the main plane of extension. In an advantageous manner, the sensor element is thus surrounded in particular on three sides by the relief slit in a plane parallel to the main plane of extension, so that bending of the supporting element in the area of the sensor element by external mechanical stresses is particularly severely suppressed. Particularly preferably, the sensor element is situated on a freestanding lip of the supporting element, so that mechanical stresses result only in a deflection of the lip relative to the main plane of extension as a whole, and not in a bending of the lip itself in the area of the sensor element.

According to one preferred specific embodiment, it is provided that a sub-area of the supporting element surrounded by the essentially U-shaped relief slit is joined in a connecting area to the rest of the supporting element, the damping element being situated in such a way that it bridges the U-shaped relief slit, preferably on a side of the sub-area facing away from the connecting area, and/or the width of the connecting area preferably being less than the width of the sub-area. In an advantageous manner, the sub-area represents an oscillator, whose oscillation characteristic according to a mass-spring damping system depends in particular on the geometry and the dimension of the connecting area to the rest of the supporting element, i.e., on the length and geometry of the relief slit, as well as on the material, geometry, and dimension of the damping element. In an advantageous manner, by selective adjustment of all or some individual ones of these named parameters it is possible to achieve a desired oscillation and/or damping behavior, in particular by adjusting the natural frequency in a simple and inexpensive manner.

According to one preferred specific embodiment, it is provided that the sensor system has a plurality of relief slits, which preferably extend at least partially around the sensor element in the plane parallel to the main plane of extension. In an advantageous manner, the sensor element is thus surrounded in particular on each of three sides by the relief slit in a plane parallel to the main plane of extension, so that bending of the supporting element in the area of the sensor element by external mechanical stresses is particularly severely suppressed.

According to one preferred specific embodiment, it is provided that the at least one relief slit has a slit depth which extends perpendicularly to the main plane of extension through the entire material thickness of the supporting element, or only through a sub-section of the entire material thickness of the supporting element. In an advantageous manner, increased stress decoupling is possible with increased slit depth. On the other hand, the mechanical stability of the sensor system is reduced as the slit depth increases. Particularly preferably, the slit depth is chosen in such a way that an optimum of stress decoupling on the one hand and stability on the other hand are achieved for the particular sensor element.

According to one preferred specific embodiment, it is provided that the at least one contact element is part of a connecting pin and/or an SMD connecting element, the contact element extending perpendicularly to the main plane of extension, preferably through the entire material thickness of the supporting element or through only a sub-section of the entire material thickness of the supporting element, so that the sensor element is electrically contactable from outside and the sensor system may be placed on a circuit board automatically, in particular using an automatic insertion machine.

According to one preferred specific embodiment, it is provided that the sensor system has an evaluation chip which makes electrical contact with the sensor element and/or with the at last one contact element preferably using bond wires, and/or that the sensor element includes a semiconductor sensor chip which includes in particular a pressure sensor, a temperature sensor, an acceleration sensor, a rotational speed sensor, a gas sensor, and/or a light sensor. In another specific embodiment, the sensor element may likewise be integrated into the evaluation chip. It is conceivable that the relief structure functions simultaneously as a supply aperture for pressure measurement, if the sensor element includes a pressure sensor. In that case the necessary hole in the cover according to the related art is dispensed with.

BRIEF DESCRIPTION OF THE DRAWINGS

FIG. 5 shows a schematic sectional view of a sensor system according to a fourth specific embodiment of the present invention.

FIG. 6 shows a schematic sectional view of a sensor system according to a fifth specific embodiment of the present invention.

DETAILED DESCRIPTION OF THE INVENTION

Figure 1:
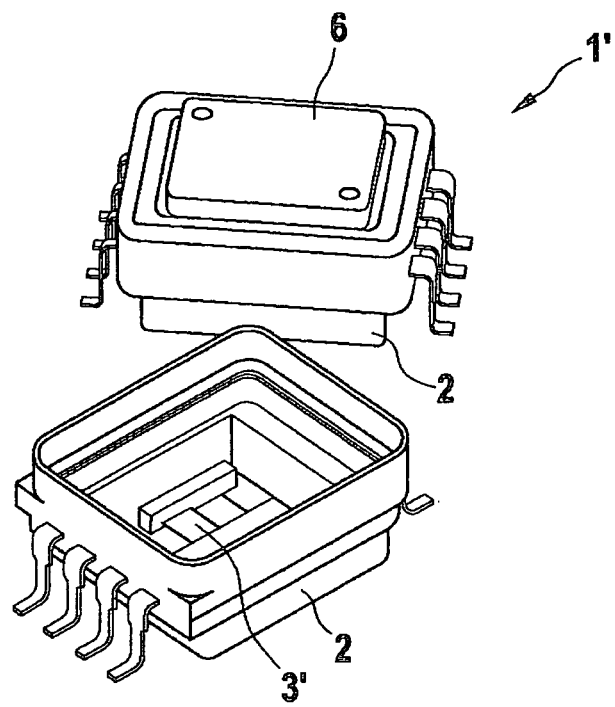
FIG. 1 shows schematic perspective views of a sensor system according to the related art.

FIG. 1 depicts schematic perspective views of a sensor system 1' according to the related art. In this case sensor system 1' has a supporting element 2, a sensor element 3 and a cover 6. Supporting element 2 includes a pre-mold housing of plastic, in which sensor element 3, in particular a micromechanical acceleration sensor, a rotational speed sensor or a pressure sensor, is situated. The pre-mold housing is sealed by cover 6 in the form of a metal cover. Furthermore, sensor system 1' has contact elements 4 in the form of connecting pins, which are used for electrical contacting of sensor element 3 from outside supporting element 2, as well as for soldering sensor system 1 onto a circuit board (not shown). Supporting element 2, cover 6, and contact elements 4 have different thermal expansion coefficients, so that under temperature fluctuations mechanical stresses develop at the interfaces, which disadvantageously cause bending of supporting element 2 in the area of sensor element 3 and thus fluctuations of the sensor parameters.

Figure 2:
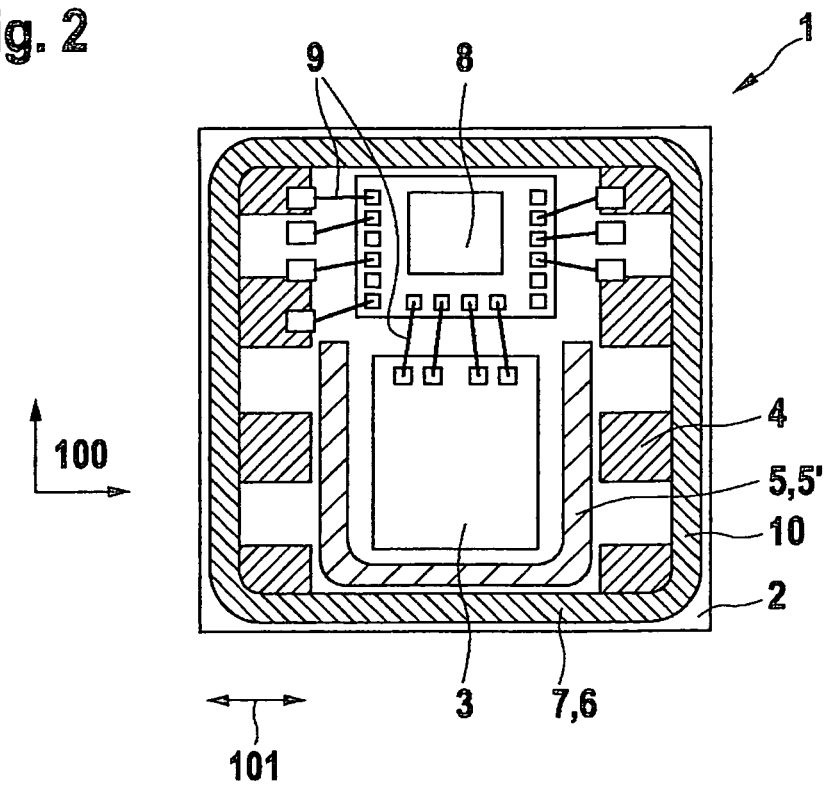
FIG. 2 shows a schematic sectional view of a sensor system according to a first specific embodiment of the present invention.

FIG. 2 depicts a schematic sectional view of a sensor system 1 according to a first specific embodiment of the present invention, the first specific embodiment of sensor system 1 being essentially similar to sensor system 1' according to the related art illustrated in FIG. 1, sensor system 1 according to the present invention additionally having a relief structure 5 in the form of a relief slit 5', which is U-shaped and extends partially around sensor element 3. Relief slit 5' in this case is situated along a main plane of extension 100 of sensor element 3 at least partially between contact elements 4 and sensor element 3, so that mechanical stresses between contact elements 4 and supporting element 2 are absorbed by relief slit 5' in such a way that bending of supporting element 2 in the area of sensor element 3 is prevented. Contact elements 4 are situated only on two opposing sides of sensor system 1, so that the mechanical stresses develop mainly along a connecting direction 101 between the two sides and are absorbed in the area of sensor element 3 by the sub-areas of relief slit 5' which run perpendicularly to connecting direction 101. Sensor system 1 also includes an evaluation chip 8, which is connected in an electrically conductive manner both to sensor elements 3 and to contact elements 4 via bond wires 9. Evaluation chip 8 includes in particular an ASIC (application-specific integrated circuit), while sensor element 3 includes in particular a micromechanical pressure sensor having a semiconductor substrate. Cover 6 is joined to supporting element 2 in a connecting area 7 running in a plane parallel to main plane of extension 100. Relief slit 5' is situated along a plane parallel to main plane of extension 100 at least partially between connecting area 7 and sensor element 3, so that mechanical stresses between cover 6 and supporting element 2 are absorbed by relief slit 5' in such a way that bending of supporting element 2 in the area of sensor element 3 is prevented. At least one of the contact elements 4 is situated in this case between connecting area 7 and relief slit 5'. The arrangement of relief slit 5' is such that in particular the projection of relief slit 5' onto a plane parallel to main plane of extension 100 is situated between a projection of sensor element 3 onto the plane and a projection of connecting area 7 and/or of a contact element 4 onto the plane. Cover 6 is joined in connecting area 7 to supporting element 2 by direct material engagement, using a soldered connection and/or adhesive bond.

Figure 3:
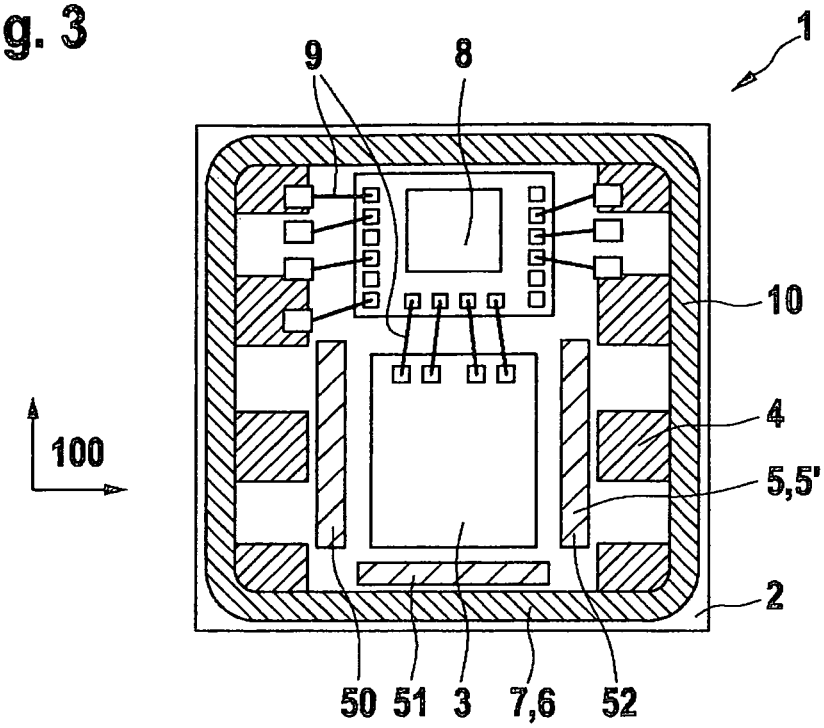
FIG. 3 shows a schematic sectional view of a sensor system according to a second specific embodiment of the present invention.

FIG. 3 depicts a schematic sectional view of a sensor system 1 according to a second specific embodiment of the present invention, the second specific embodiment being essentially the same as the first specific embodiment illustrated in FIG. 2, relief slit 5' not being formed as a continuous U-shaped relief slit 5' but being divided into three sub-relief slits 50, 51, 52, which are situated partially around sensor element 3 and in particular in a U-shape.

Figure 4:
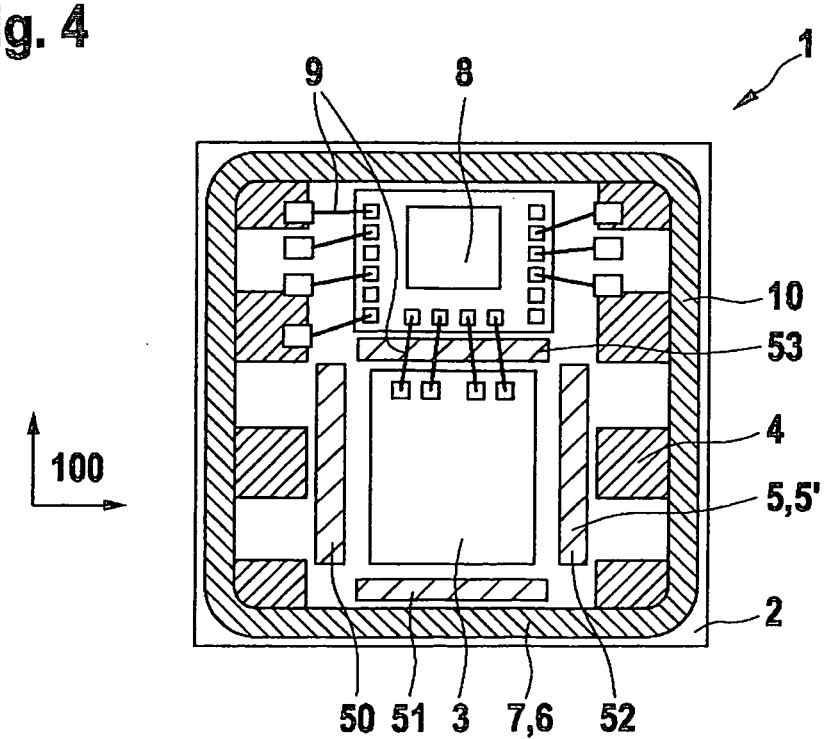
FIG. 4 shows a schematic sectional view of a sensor system according to a third specific embodiment of the present invention.

FIG. 4 depicts a schematic sectional view of a sensor system according to a third specific embodiment of the present invention, the third specific embodiment being essentially the same as the second specific embodiment illustrated in FIG. 3, sensor system 1 having a fourth sub-relief slit 53 which is situated between sensor element 3 and evaluation chip 8. Supporting element 2 is nearly completely surrounded in the area of sensor element 3 by relief slits 5', so that bending of supporting element 2 in the area of sensor element 3 is effectively prevented.

FIG. 5 depicts a schematic sectional view of a sensor system 1 according to a fourth specific embodiment of the present invention, the fourth specific embodiment being essentially the same as the first specific embodiment illustrated in FIG. 2, connecting area 7 being subdivided into two first adhesion areas 10 and two second adhesion areas 11. First adhesion areas 10 each include a rigid connection between cover 6 and supporting element 2, which increases the overall stability of sensor system 1. Second adhesion areas 11 include an elastic connection between cover 6 and supporting element 2, which together with first adhesion areas 10 protect sensor element 3 and evaluation chip 8 from external influences such as sawing water and the like. Second adhesion areas 11, which include for example a soft adhesive, are situated on the two opposing sides of supporting element 2, along which contact elements 4 are also situated. Along connecting direction 101 there is thus only comparatively little or no mechanical stress generated between cover 6 and supporting element 2 due to temperature fluctuations, so that bending of supporting element 2 in the area of sensor element 3 is additionally suppressed along connecting direction 101. Only on the remaining top and bottom sides 12, 13 of supporting element 2 are there mechanical stresses acting between cover 6 and supporting element 2 due to rigid first adhesion areas 10, whereby the mechanical stability of sensor system 1 is, however, also simultaneously increased.

FIG. 6 illustrates a schematic sectional view of a sensor system 1 according to a fifth specific embodiment of the present invention, the fifth specific embodiment being essentially the same as the fourth specific embodiment illustrated in FIG. 5, second adhesion areas 11 being formed on all four lateral edges of supporting element 2 and first adhesion areas 10 being formed only in the corners of supporting element 2. The mechanical stresses in connecting area 7 are thus further reduced.

Figure 7:
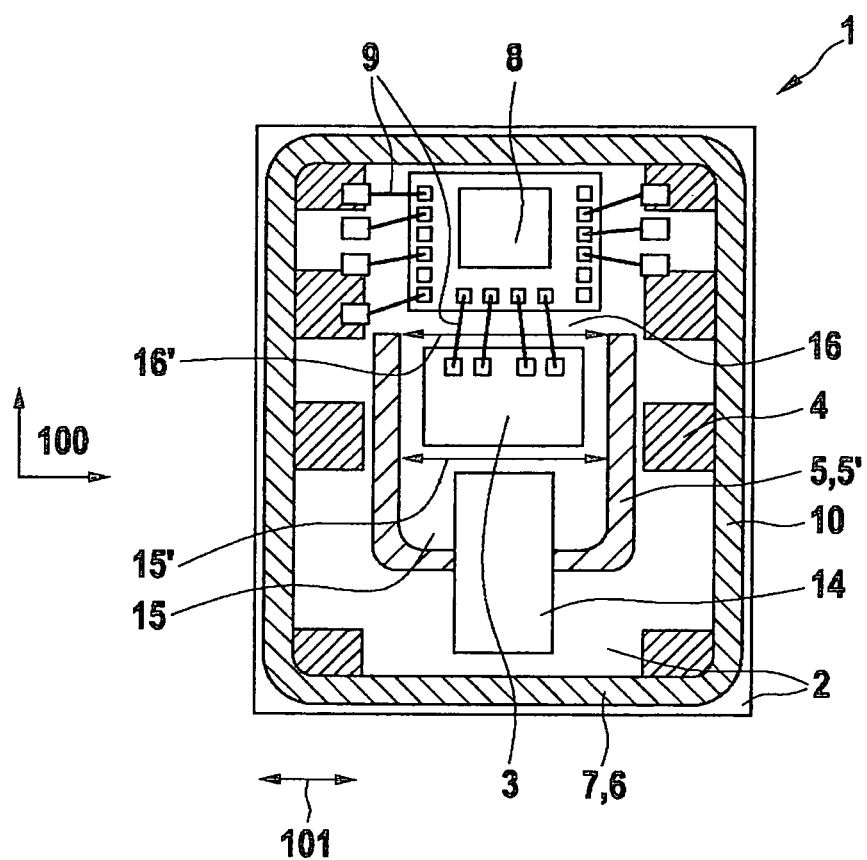
FIG. 7 shows a schematic sectional view of a sensor system according to a sixth specific embodiment of the present invention.

FIG. 7 depicts a schematic sectional view of a sensor system 1 according to a sixth specific embodiment of the present invention, the sixth specific embodiment being essentially the same as the first specific embodiment illustrated in FIG. 2, sensor system 1 having in addition a damping element 14. Damping element 14 includes a silicone material. Relief slit 5' is U-shaped, in such a way that a sub-section 15 supporting element 2 is thereby defined, which is surrounded by U-shaped relief slit 5' and to which sensor element 3 is attached. This sub-section 15 represents an oscillator, which is able to oscillate relative to the rest of supporting element 2. In a connecting area 16, sub-section 15 is joined to the rest of supporting element 2 rigidly and in a single piece. On a side opposite connecting area 16, U-shaped relief slit 5' is bridged over by damping element 14 in such a way that a first end of damping element 14 is connected to sub-section 15 and a second end of damping element 14 is connected to the rest of supporting element 2. Damping element 14 is preferably bonded to supporting element 2. This is done for example in a conventional automatic insertion machine, such as is also normally used for populating with condensers or resistors. The material properties, dimension, and geometry of damping element 14 are selected in such a way that a desired oscillation and damping characteristic is achieved.

Figure 8:
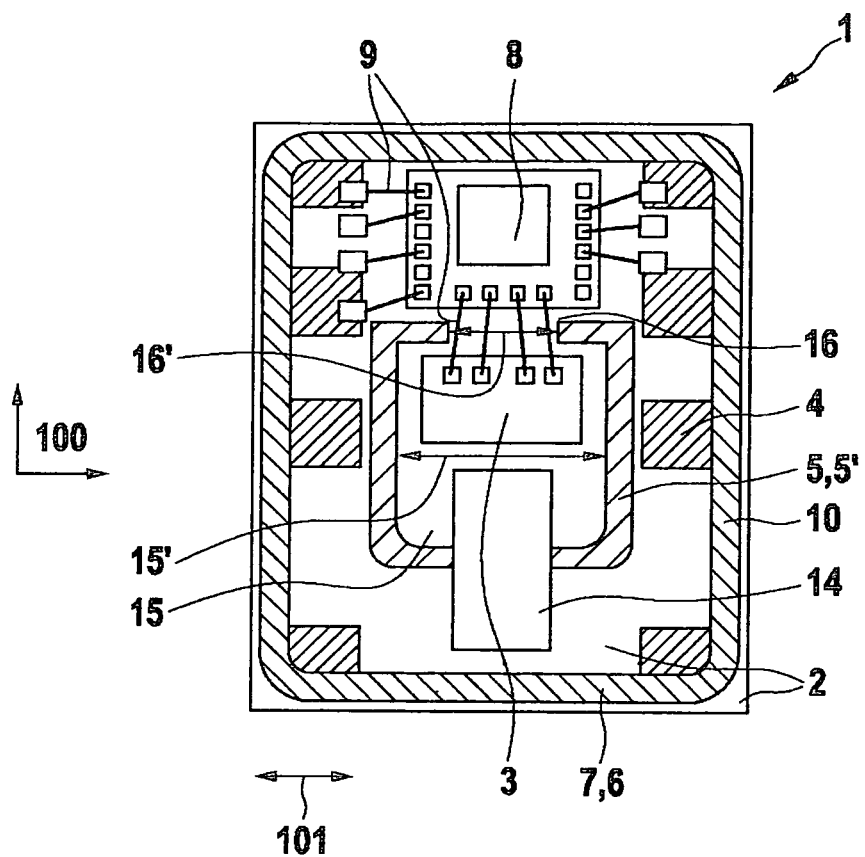
FIG. 8 shows a schematic sectional view of a sensor system according to a seventh specific embodiment of the present invention.

FIG. 8 depicts a schematic sectional view of a sensor system 1 according to a seventh specific embodiment of the present invention, the seventh specific embodiment being essentially the same as the sixth specific embodiment illustrated in FIG. 7, the end areas of the essentially U-shaped relief slit 5' being angled relative to each other and elongated in such a way that the width 16' of connecting area 16 is reduced compared to the width 15' of sub-section 15. In this way, the oscillation characteristic is typically modified so that the natural frequency shifts toward lower frequencies. The characteristic of the mass-spring damping system is thus determined both by the material of damping element 14 and by the structure, i.e., the length and the geometry of relief slit 5'. The damping characteristic of damping element 14 may be adjusted both by the intrinsic material properties and by its geometry. Adjustment by way of the width and height of damping element 14 is also conceivable.

Figure 9:
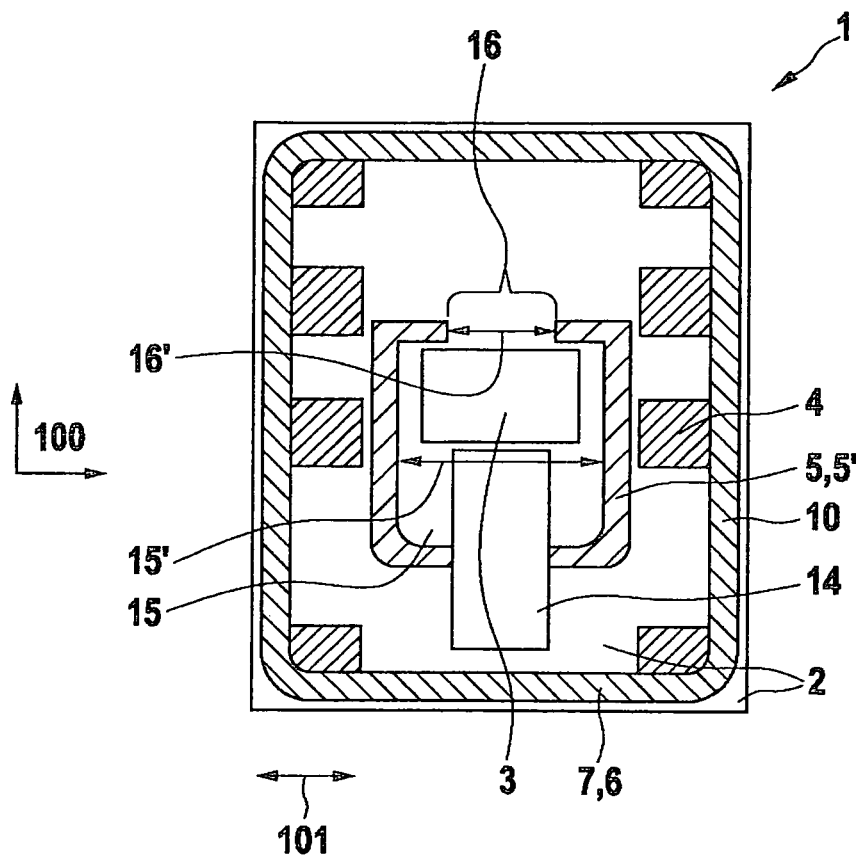
FIG. 9 shows a schematic sectional view of a sensor system according to an eighth specific embodiment of the present invention.

FIG. 9 depicts a schematic sectional view of a sensor system 1 according to an eighth specific embodiment of the present invention, the eighth specific embodiment being essentially the same as the seventh specific embodiment illustrated in FIG. 8, evaluation chip 8 and sensor element 3 being integrated into a common sensor module 17. FIG. 9 shows an LGA sensor module. Alternatively, SOIC sensor modules are, however, also conceivable. According to another alternative, it is conceivable that supporting element 2 includes a circuit board on which sensor module 17 is situated. In this alternative, relief slit 5' is placed directly in the circuit board, so that sub-section 16 of the circuit board surrounded by relief slit 5', on which sensor module 17 is also situated, is able to oscillate relative to the rest of the circuit board.

What is claimed is:

1. A sensor system, comprising:
   a sensor element having a main plane of extension; and
   a supporting element attached to the sensor element, wherein the supporting element has (i) at least one contact element for electrical contacting of the sensor system, and (ii) at least one relief structure for stress decoupling, the at least one relief structure being situated in a plane parallel to the main plane of extension essentially between the at least one contact element and the sensor element; and
   at least one damping element attached to the supporting element in such a way that the at least one relief structure is bridged over by the damping element;
   wherein the relief structure includes a cut-out in the supporting element;
   wherein the cutout is a relief slit configured essentially U-shaped in a plane parallel to the main plane of extension, the relief slit extending at least partially around at least three sides of the sensor element in the plane parallel to the main plane of extension and surrounding a sub-area of the supporting element;
   wherein the sub-area is oscillatable with respect to a remainder of the supporting element;
   wherein the damping element includes a first end connected to the sub-area and a second end connected to the remainder of the supporting element,
   wherein an oscillating characteristic and a damping characteristic of the sub-area depends on at least one of a material property, a dimension, and a geometry of the damping element.

2. The sensor system as recited in claim 1, further comprising:
   a cover joined in a first connecting area to the supporting element, the at least one relief structure being situated in a plane parallel to the main plane of extension essentially between the first connecting area and the sensor element.

3. The sensor system as recited in claim 2, wherein the first connecting area includes a first adhesion area and a second adhesion area, the cover being rigidly connected to the supporting element in the first adhesion area, and the cover being less rigidly connected to the supporting element in the second adhesion area than in the first adhesion area.

4. The sensor system as recited in claim 2, wherein the at least one contact element is situated in a plane parallel to the main plane of extension between the at least one relief structure and the first connecting area.

5. The sensor system as recited in claim 1, wherein the sub-area of the supporting element surrounded by the essentially U-shaped relief slit is joined in a second connecting area to the rest of the supporting element, the damping element being situated in such a way that it bridges the U-shaped relief slit on a side of the sub-area facing away from the second connecting area, and the width of the second connecting area being less than the width of the sub-area.

6. The sensor system as recited in claim 1, wherein the essentially U-shaped relief slit has a slit depth which extends perpendicularly to the main plane of extension through the entire material thickness of the supporting element.

7. The sensor system as recited in claim 1, wherein the at least one contact element is at least one of a part of a connecting pin and an SMD connecting element, the at least one contact element extending perpendicularly to the main plane of extension through the entire material thickness of the supporting element, and wherein the sensor system has an evaluation chip which makes electrical contact with at least one of the sensor element and the at least one contact element.

8. The sensor system as recited in claim 1, wherein the sensor element is fastened on the sub-area.

* * * * *